US008146241B1

(12) United States Patent
Thompson, Sr. et al.

(10) Patent No.: US 8,146,241 B1
(45) Date of Patent: Apr. 3, 2012

(54) TOOL FOR RECONFIGURING THE PINS OF A TRACTOR TRAILER ELECTRICAL CONNECTOR

(75) Inventors: Barry Thompson, Sr., Middleburg, FL (US); Richard Thompson, Jacksonville, FL (US); Carolyn Thompson, Brooklet, GA (US)

(73) Assignee: Zinstar Innovations, Inc., Jacksonville, FL (US)

( * ) Notice: Subject to any disclaimer, the term of this patent is extended or adjusted under 35 U.S.C. 154(b) by 0 days.

(21) Appl. No.: 13/211,302

(22) Filed: Aug. 16, 2011

(51) Int. Cl.
*H05K 3/30* (2006.01)

(52) U.S. Cl. ................. 29/739; 29/278; 29/758; 29/762

(58) Field of Classification Search ............ 29/751–758, 29/762–768; 439/589, 447, 606, 492, 354
See application file for complete search history.

(56) References Cited

U.S. PATENT DOCUMENTS

| | | | | |
|---|---|---|---|---|
| 4,083,101 | A * | 4/1978 | Coller | 29/739 |
| 4,969,839 | A * | 11/1990 | Nilsson | 439/395 |
| 5,302,141 | A * | 4/1994 | O'Reilly et al. | 439/680 |
| 5,385,476 | A * | 1/1995 | Jasper | 439/38 |
| 5,816,825 | A * | 10/1998 | Sekimori et al. | 439/39 |
| 6,007,346 | A * | 12/1999 | Gutierrez et al. | 439/35 |
| 6,678,945 | B2 * | 1/2004 | Eaton et al. | 29/762 |
| 7,575,450 | B2 * | 8/2009 | Williams et al. | 439/144 |

* cited by examiner

*Primary Examiner* — Minh Trinh
(74) *Attorney, Agent, or Firm* — Mark Young, P.A.

(57) ABSTRACT

A tool for reconfiguring the pins of an SAE J560 electrical connector includes a handle and head. A plurality of openings provided in the free end of the head lead to a plurality of parallel equal diameter channels within the head. An elongate separator pin with a conical nose and a cylindrical body is concentrically fixed within each channel. The separator pins are configured to properly separate split electrode pins of an SAE J560 electrical connector, which inevitable deform through repeated coupling and decoupling.

18 Claims, 5 Drawing Sheets

TOOL FOR RECONFIGURING THE PINS OF A TRACTOR TRAILER ELECTRICAL CONNECTOR

FIELD OF THE INVENTION

This invention relates generally to vehicular electrical connectors, and, more particularly, to a tool for reconfiguring the pins of an SAE J560 electrical connector used to electrically couple a tractor to a trailer.

BACKGROUND

A standard seven-pin (six circuits and one ground) SAE J560 electrical connector is commonly used to transmit electrical signals between a tractor and a trailer. One component comprises a receptacle containing seven pins. SAE J560 refers to a published standard by the Society of Automotive Engineers, "Primary and Auxiliary Seven Conductor Electrical Connector for Truck-Trailer Jumper Cable" SAE J560 (2009). The pins of such a connector are typically split pins. The mating component is a plug with seven sockets configured to receive the seven pins. The receptacle is typically provided on a trailer, while the plug is typically connected to a self-coiling cable attached to the rear of the tractor.

The electrical signals include lighting and ABS braking signals. Failure of the connector could result in a catastrophic vehicular accident.

The plug and receptacle are frequently mated and separated. This cycle repeats each time a trailer is separated from and hitched to a tractor. This repetitive cycle can be hostile to the integrity and alignment of the pins. The split pins are particularly vulnerable to deformation such as spreading, compression and other bending. As a consequence, the deformed pins may not make sound contact with the socket terminals unless the pins are straightened, and the split terminals are spread apart to the diameter of the socket and the pins are aligned with the sockets.

Unfortunately, straightening, spreading and re-aligning pins can be extremely tedious. Typically, a driver will urge each pin to a desired position using a screw driver. The process is imprecise and time consuming. Frequently, pins are accidently broken in the process. When a pin is broken, the receptacle must be removed and replaced, at great delay and expense. A need exists for a tool to quickly and reliably reconfigure the split pins of a SAE J560 electrical connector.

The invention is directed to overcoming one or more of the problems and solving one or more of the needs as set forth above.

SUMMARY OF THE INVENTION

To solve one or more of the problems set forth above, in a exemplary implementation of the invention, a tool. A tool for reconfiguring the pins of an electrical connector used to electrically couple a tractor to a trailer includes a handle having a proximal end and distal end. A head is attached to the distal end of the handle. The head has a free end and an attached end. The attached end is opposite the free end and attached to the distal end of the handle. A plurality of openings are provided in the free end of the head. The plurality of openings lead to a plurality of parallel channels within the head. Each opening leads to one channel. Six of the seven channels are equal in diameter and length to each other channel. The top (12 o'clock) channel is deeper and larger diameter than the others to accommodate a larger split pin electrode that protrudes further. An elongate separator pin is fixed within each channel. The separator pin is concentric with the channel and has a conical nose attached to a cylindrical body. Each elongate separator pin includes a collar at a distal end of the body and a tail at a distal end of the collar. The collar is fastened to the head. The electrical connector is an SAE J560 electrical connector. Each opening in the free end of the head may have a larger diameter than a diameter of the channel to which the opening leads. The edges of each opening may be filleted, chamfered or beveled. A hand grip may be provided on the handle. The handle and head may be comprised of plastic and the elongate separator pins may be comprised of metal.

The head may have an outer periphery between the free end and the attached end, and a key tab on the outer periphery. The key tab is sized and positioned to mate with a key slot in a receptacle of the electrical connector. The plurality of openings includes seven openings in the free end of the head.

The tool may include a thumb guard attached to the handle. The thumb guard defines a curved cove against which a thumb may rest. The thumb guard has a height (e.g., ⅜ to 1 inch) greater than the width of a thumb. The thumb guard protects the thumb from a cover for a receptacle of the electrical connector. If the head is keyed, then the key tab and thumb guard may be aligned.

Each elongate separator pin is about 20 to 40 mm in length and has a maximum diameter of about 1.5 to 3 mm. Each channel has a depth of about 15 to 30 mm and a diameter of approximately 6 to 10 mm.

BRIEF DESCRIPTION OF THE DRAWINGS

The foregoing and other aspects, objects, features and advantages of the invention will become better understood with reference to the following description, appended claims, and accompanying drawings, where:

Those skilled in the art will appreciate that the figures are not intended to be drawn to any particular scale; nor are the figures intended to illustrate every embodiment of the invention. The invention is not limited to the exemplary embodiments depicted in the figures or the shapes of pins, handle configuration, shapes, relative sizes, ornamental aspects or proportions shown in the figures.

DETAILED DESCRIPTION

Figure 1:
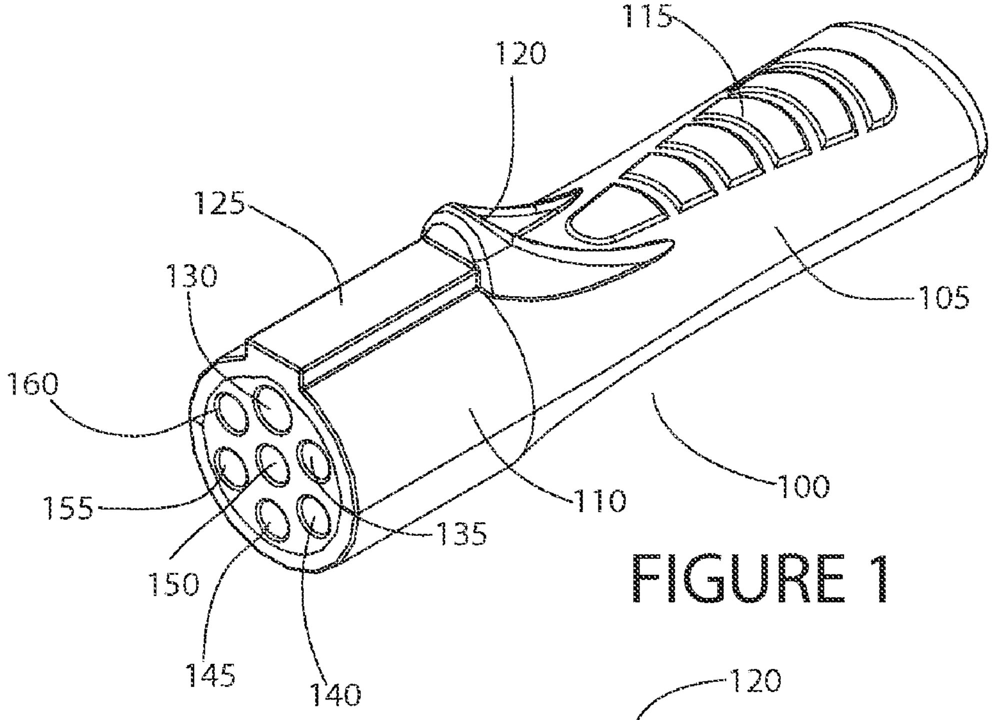
FIG. 1 is a top perspective view of an exemplary tool according to principles of the invention.

Referring to FIG. 1, an exemplary tool 100 for reconfiguring the pins of an SAE J560 electrical connector used to electrically couple a tractor to a trailer according to principles of the invention is shown. The tool 100 includes a handle 105, a head 110 attached to the end of the handle 105, a key 125 for engaging the keyed slot opening of a corresponding receptacle, such as the receptacles shown in FIGS. 7 through 9, a thumb guard 120 and a grip 115.

The thumb guard 120 is a raised curved shield configured to receive a thumb. The height of the thumb guard 120 is equal to or greater than the thickness of a typical thumb. A height of ⅜-inch to 1-inch may be used, with a height of ½ to ¾ inches being preferred. Receptacles into which the tool 100 is inserted typically have a hinged door or cover that is spring biased into a closed position, such as the cover 315 shown in FIG. 7. The spring exerts considerable torque. The thumb guard 120 protects the thumb from the cover 315 when the tool 100 is being used.

The tool includes features to prevent a grasping hand from slipping. The thumb guard 120 provides a stop against which a thumb may push. The exemplary grip 115 is a textured surface 115 on the handle. Other non-slip grips may be utilized, including sleeves and overmolded features.

Figure 2:
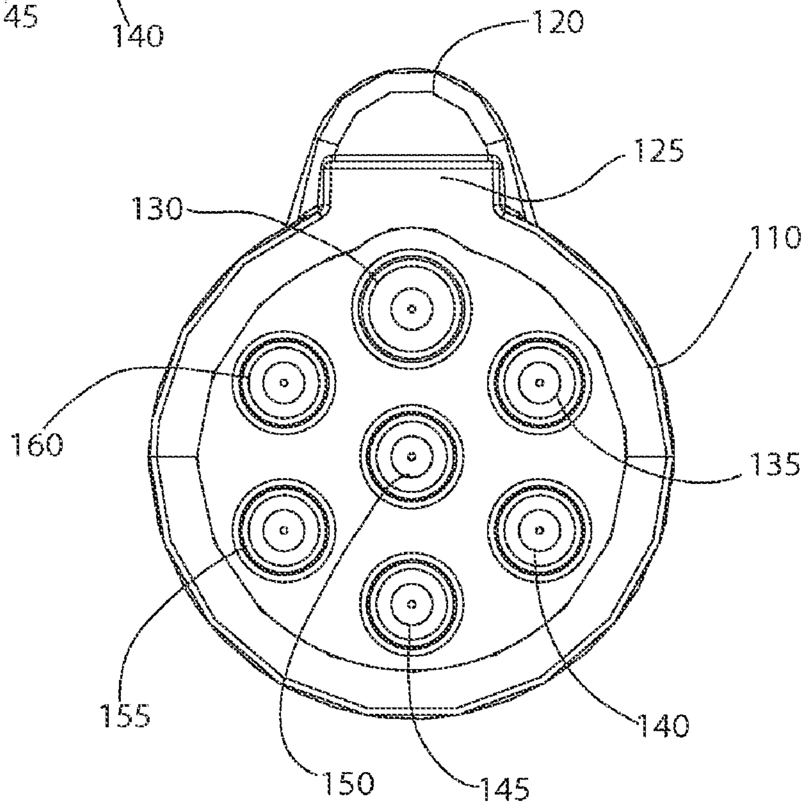
FIG. 2 is a front view of an exemplary tool according to principles of the invention.
Figure 3:
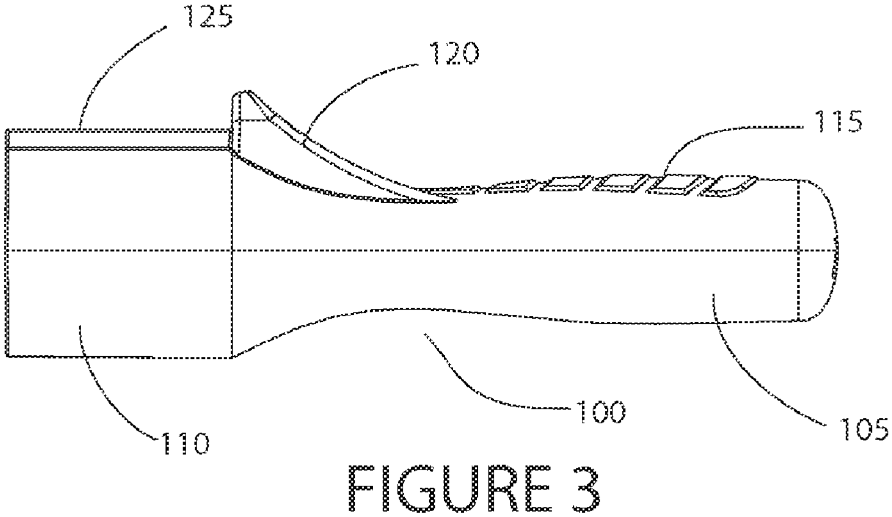
FIG. 3 is aside view of an exemplary tool according to principles of the invention.

The head 110, as shown in FIGS. 1 and 2, includes a plurality of openings 130, 135, 140, 145, 150, 155, 160 ("130-160"). Seven openings 130-160 are shown. Each opening leads to a channel. By way of example, openings 130, 145 and 150 are shown for channels 165, 170 and 175 in the side section view of FIG. 4. Though three channels are shown, it is understood that each opening leads to a channel. Most of the channels are parallel and of equal depth. A depth of about 15 to 30 mm is preferred. Each channel is configured (i.e., sized and positioned) to receive a split electrode pin of a receptacle. The channel 165 at the twelve o'clock position is larger in diameter and deeper than the others because it receives a larger electrode that protrudes more from the receptacle than the other electrodes. A channel diameter of approximately 6 to 10 mm is preferred. The opening for a channel 130, 145 and 150 is preferably filleted, chamfered or beveled and has a slightly larger diameter (e.g., 101% to 125%) than the channel 165, 170 and 175 to facilitate receipt of a split electrode pin.

Figure 4:
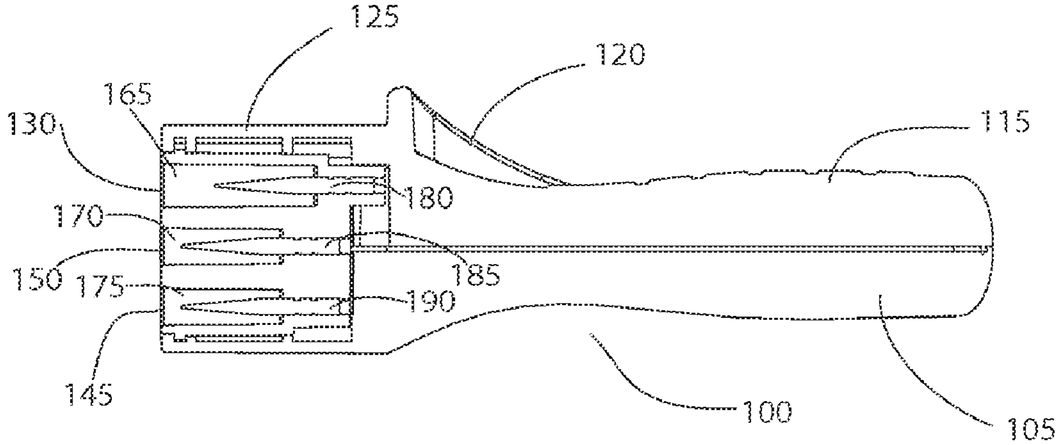
FIG. 4 is a side section view of an exemplary tool according to principles of the invention.
Figure 5:
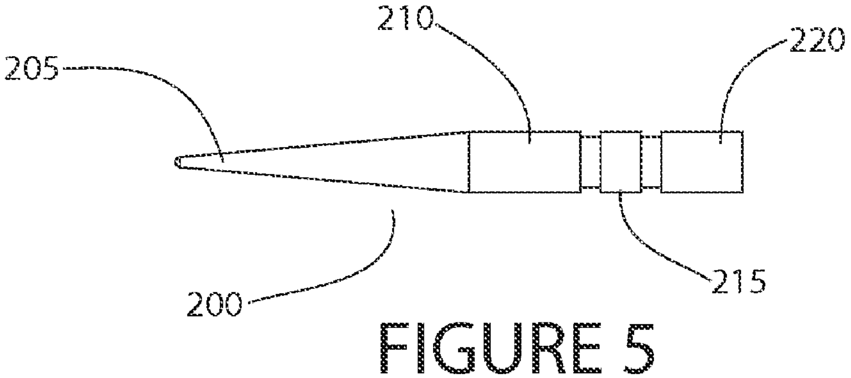
FIG. 5 is a side view of an exemplary spreading pin for a tool according to principles of the invention.
Figure 6:
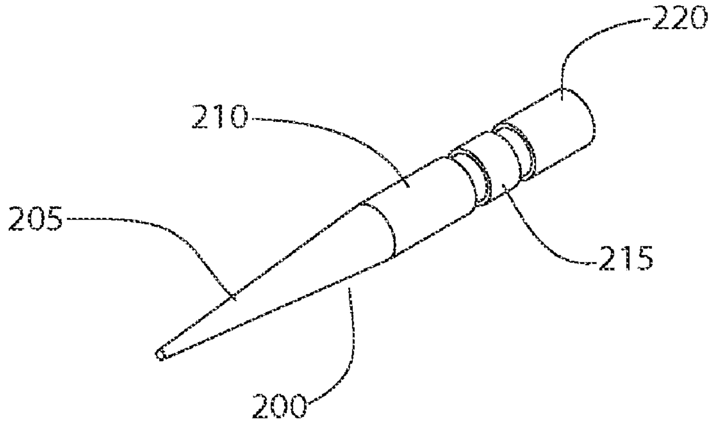
FIG. 6 is a top perspective view of an exemplary spreading pin for a tool according to principles of the invention.

A spreading pin 180, 185, 190 is provided within each channel. Although three pins are shown in FIG. 4, it is understood that every opening leads to a channel and every channel has a pin. As shown in FIGS. 5 and 6, each spreading pin 200 includes a conical nose 205, a cylindrical body 210, a collar 215 and a tail 220. The collar 215 defines an area to be molded into, snap fit into or fastened into the head 110. Each spreading pin is concentric with its channel. The pin may be snap fit, bonded and/or fastened to the head 110 within the channel. Each pin is preferably about 20 to 40 mm in length (from tip of nose 205 to tail 220) and has a maximum diameter of about 1.5 to 3 mm at the body 210 and a conical nose 205 with a length of approximately one half of the total length of the spreading pin 180, 185, 190. The spreading pins are rigid, capable of withstanding repeated use and suitable for spreading split pin electrodes to their original un-deformed configuration. Metals, plastics and composites may be used for the spreading pins.

Often, the split electrodes are not aligned. Sometimes the slot in the electrode may be horizontal, vertical or some other orientation. A blade-like spreading pin will not work unless the slot in an electrode and the blade-like pin are properly aligned. After extensive experimentation, it was found that the spreading pin 200, which includes a conical nose 205 and a cylindrical body 210 that has a diameter equal to the desired spread between the split electrode sections, works well, consistently, regardless of pin orientation.

Figure 7:
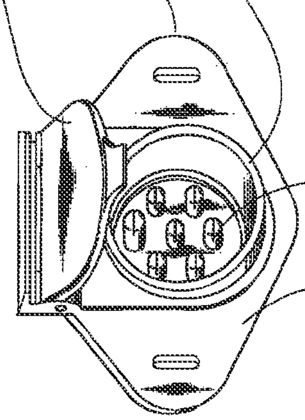
FIG. 7 is a front perspective view of an exemplary seven-pin receptacle with a hinged cover according to principles of the invention.

Referring now to FIG. 7 an exemplary receptacle 300 is shown. The receptacle includes a mounting plate 305, a sleeve 310, a spring biased cover 315 and a plurality of (e.g., seven) split pin electrodes within the sleeve 310. The sleeve is keyed with a slot 325 at the top, as more clearly shown in the embodiment of FIG. 8. The slot 325 receives the key 125 at the head of the tool 100. The cover 315 is omitted from FIGS. 8 and 9 for clarity.

Figure 8:
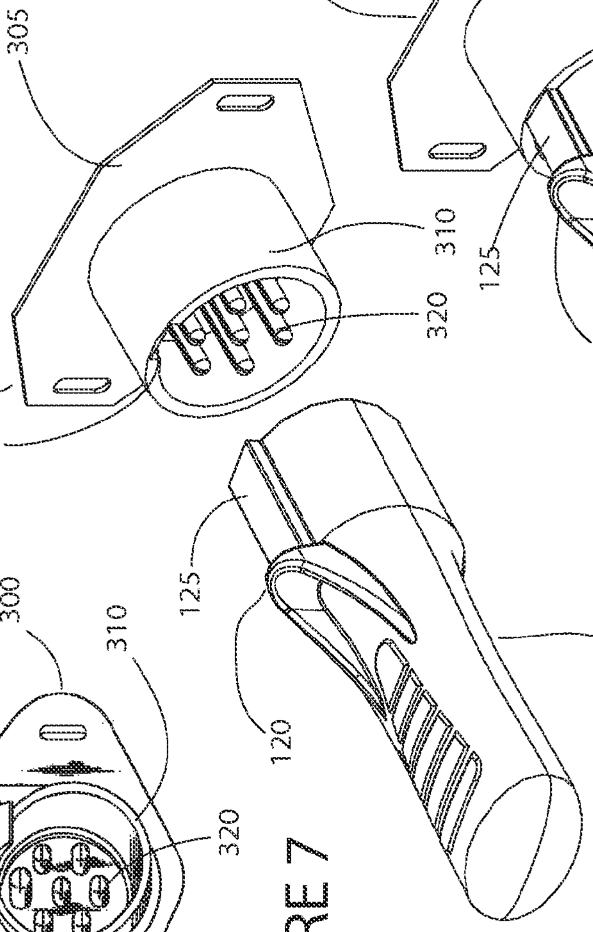
FIG. 8 is a schematic conceptually illustrating use of an exemplary tool according to principles of the invention with a seven-pin receptacle.
Figure 9:
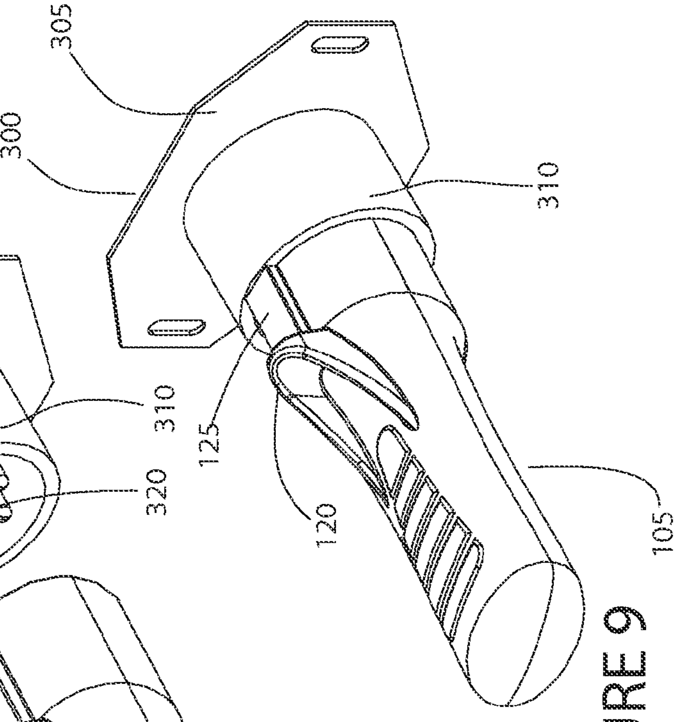
FIG. 9 is another schematic conceptually illustrating use of an exemplary tool according to principles of the invention with a seven-pin receptacle.

FIG. 7 shows a receptacle without the tool. FIG. 8 illustrates the tool being positioned for inserting into the receptacle. FIG. 9 illustrates the tool inserted into the receptacle.

Figure 10:
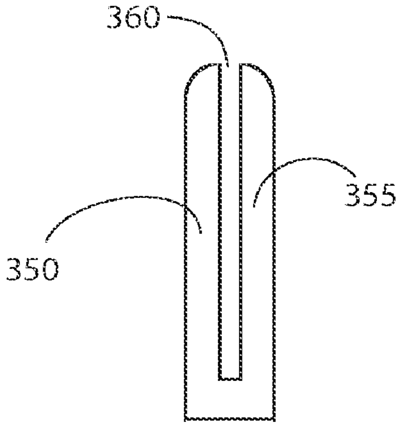
FIG. 10 is a side view of an exemplary un-deformed split electrode pin for a receptacle according to principles of the invention.
Figure 11:
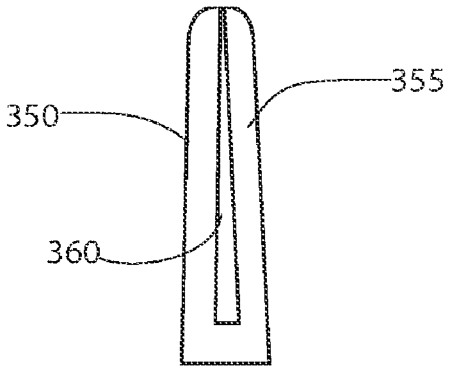
FIG. 11 is a side view of an exemplary deformed split electrode pin for a receptacle according to principles of the invention.

Referring now to FIGS. 10 and 11, split electrode pins are conceptually shown. The split pins include a first electrode section 350 and a second electrode section 355 substantially separated by an elongate slit 360. In FIG. 10, a pin is shown with the sections 350, 355 substantially parallel and an even space 360 between the sections. The width of the slit 360 (e.g., measured from the first section 350 to the second section 355) is about the diameter of the body 210 of a spreading pin 200.

When the pin has been squeezed, the first section 350 and the second section 355 come together, as shown in FIG. 11. Such bending deformation of the first section 350 and second section 355 frequently occurs during disconnection of a trailer from a tractor. When the pin is deformed as shown in FIG. 11, the bent sections 350, 355 may not consistently maintain good contact with the receiving sleeve-like electrode of a mating connector. In such case, trailer lighting and/or trailer ABS braking may fail. To avoid such failure, each pin should be restored to its un-deformed configuration, as shown in FIG. 10, before a coupling is completed.

Referring again to FIGS. 7 through 9, use of the tool to restore each split electrode pin to its un-deformed configuration entails the following steps. First, the cover 315 of the receptacle 300 is lifted, as shown in FIG. 7. Then the head 110 of the tool 100 is aligned with the sleeve 310, with the key tab 125 aligned with the key slot 325, as shown in FIG. 8. In this configuration, each opening 130-160 and each corresponding channel will matingly receive a split electrode pin 320 when the head 110 of the tool 100 is inserted into the sleeve 310 of the receptacle 300, as shown in FIG. 9. A spreading pin 200 within each channel will urge the sections 350, 355 of the split electrode pin 320 to their un-deformed configuration, thus ensuring a good electrical connection. Because the openings 130-160 are wider than the channel, even a slightly askew, oblique or otherwise bent electrode may easily be guided into the channel. The spreading pin 200 does not spread the pins more than is needed. The channels also prevent spreading of the pin sections 350, 355 further apart than appropriate for good electrical contact when coupled. Advantageously, all seven electrode pins are properly configured by the tool simultaneously. While the tool is used, the thumb guard 120 shields the user's thumb from the cover 315. After full insertion of the head 110 of the tool 100 into the sleeve 310 of the receptacle, the head 110 may be withdrawn from the sleeve 310 and the cover 315 may close.

While an exemplary embodiment of the invention has been described, it should be apparent that modifications and variations thereto are possible, all of which fall within the true spirit and scope of the invention. With respect to the above description then, it is to be realized that the optimum relationships for the components and steps of the invention, including variations in order, form, content, function and manner of operation, are deemed readily apparent and obvious to one skilled in the art, and all equivalent relationships to those illustrated in the drawings and described in the specification are intended to be encompassed by the present invention. The above description and drawings are illustrative of modifications that can be made without departing from the present invention, the scope of which is to be limited only by the following claims. Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents are intended to fall within the scope of the invention as claimed.

What is claimed is:

1. A tool for reconfiguring the pins of an electrical connector used to electrically couple a tractor to a trailer, said tool comprising:

a handle having a proximal end and distal end;

a head attached to the distal end of the handle, said head having a free end and an attached end, the attached end being opposite the free end and attached to the distal end of the handle;

a plurality of openings in the free end of the head, the plurality of openings leading to a plurality of parallel channels within the head, each opening leading to one channel, each channel, except one channel, being equal in diameter and length to each other channel; and an elongate separator pin fixed within each channel, the separator pin being concentric with the channel and having a conical nose attached to a cylindrical body, said cylindrical body having a diameter equal to a determined electrode section separation; and each elongate separator pin including collar at a distal end of the body and a tail at a distal end of the collar, said collar being fastened to the head.

2. The tool for reconfiguring the pins of an electrical connector used to electrically couple a tractor to a trailer according to claim 1, wherein said handle and head are comprised of plastic and said elongate separator pins are comprised of metal.

3. The tool for reconfiguring the pins of an electrical connector used to electrically couple a tractor to a trailer according to claim 1, said head further having an outer periphery between the free end and the attached end, and a key tab on said outer periphery, said key tab being sized and positioned to mate with a key slot in a receptacle of the electrical connector.

4. The tool for reconfiguring the pins of an electrical connector used to electrically couple a tractor to a trailer according to claim 1, said plurality of openings comprising seven openings in the free end of the head.

5. The tool for reconfiguring the pins of an electrical connector used to electrically couple a tractor to a trailer according to claim 1, each opening in the free end of the head having a larger diameter than a diameter of the channel to which the opening leads.

6. The tool for reconfiguring the pins of an electrical connector used to electrically couple a tractor to a trailer according to claim 1, each opening in the free end of the head having a beveled edge.

7. The tool for reconfiguring the pins of an electrical connector used to electrically couple a tractor to a trailer according to claim 1, each opening in the free end of the head having a filleted edge.

8. The tool for reconfiguring the pins of an electrical connector used to electrically couple a tractor to a trailer according to claim 1, each opening in the free end of the head having a chamfered edge.

9. The tool for reconfiguring the pins of an electrical connector used to electrically couple a tractor to a trailer according to claim 1, further comprising a thumb guard attached to the handle, said thumb guard defining a curved cove against which a thumb may rest, the thumb guard having a height greater than the width of a thumb, the thumb guard protecting the thumb from a cover for a receptacle of the electrical connector.

10. The tool for reconfiguring the pins of an electrical connector used to electrically couple a tractor to a trailer according to claim 1, said head further having an outer periphery between the free end and the attached end, and a key tab on said outer periphery, said key tab being sized and positioned to mate with a key slot in a receptacle of the electrical connector, and said tool further comprising a thumb guard attached to the handle, said thumb guard defining a curved cove against which a thumb may rest, the thumb guard having a height greater than the width of a thumb, the thumb guard protecting the thumb from a cover for a receptacle of the electrical connector, said thumb guard being aligned with the key tab.

11. The tool for reconfiguring the pins of an electrical connector used to electrically couple a tractor to a trailer according to claim 1, said handle further comprising a hand grip.

12. A tool for reconfiguring the pins of an electrical connector used to electrically couple a tractor to a trailer, said tool comprising:

a handle having a proximal end and distal end;

a head attached to the distal end of the handle, said head having a free end and an attached end, the attached end being opposite the free end and attached to the distal end of the handle;

a plurality of openings in the free end of the head, the plurality of openings leading to a plurality of parallel channels within the head, each opening leading to one channel, each channel, except one channel, being equal in diameter and length to each other channel; and an elongate separator pin fixed within each channel, the separator pin being concentric with the channel and having a conical nose attached to a cylindrical body, said cylindrical body having a diameter equal to a determined electrode section separation, said electrical connector being an SAE J560 electrical connector; and said head further having an outer periphery between the free end and the attached end, and a key tab on said outer periphery, said key tab being sized and positioned to mate with a key slot in a receptacle of the electrical connector; and said plurality of openings comprising seven openings in the free end of the head, and each opening in the free end of the head having a larger diameter than a diameter of the channel to which the opening leads.

13. The tool for reconfiguring the pins of an electrical connector used to electrically couple a tractor to a trailer according to claim 12, further comprising a thumb guard attached to the handle, said thumb guard defining a curved cove against which a thumb may rest, the thumb guard having a height greater than the width of a thumb, the thumb guard protecting the thumb from a cover for a receptacle of the electrical connector.

14. The tool for reconfiguring the pins of an electrical connector used to electrically couple a tractor to a trailer according to claim 12, said head further having an outer periphery between the free end and the attached end, and a key tab on said outer periphery, said key tab being sized and positioned to mate with a key slot in a receptacle of the electrical connector, and said tool further comprising a thumb guard attached to the handle, said thumb guard defining a curved cove against which a thumb may rest, the thumb guard having a height greater than the width of a thumb, the thumb guard protecting the thumb from a cover for a receptacle of the electrical connector, said thumb guard being aligned with the key tab.

15. The tool for reconfiguring the pins of an electrical connector used to electrically couple a tractor to a trailer according to claim 12, each elongate separator pin including collar at a distal end of the body and a tail at a distal end of the collar, said collar being fastened to the head.

16. The tool for reconfiguring the pins of an electrical connector used to electrically couple a tractor to a trailer according to claim 12, each elongate separator pin being about 20 to 40 mm in length and having a maximum diameter of about 1.5 to 3 mm, and each channel having a depth of about 15 to 30 mm and a diameter of approximately 6 to 10 mm.

17. A tool for reconfiguring the pins of an electrical connector used to electrically couple a tractor to a trailer, said tool comprising:

a handle having a proximal end and distal end;

a head attached to the distal end of the handle, said head having a free end and an attached end, the attached end being opposite the free end and attached to the distal end of the handle;

a plurality of openings in the free end of the head, the plurality of openings leading to a plurality of parallel channels within the head, each opening leading to one channel, each channel, except one channel, being equal in diameter and length to each other channel; and an elongate separator pin fixed within each channel, the separator pin being concentric with the channel and having a conical nose attached to a cylindrical body, said cylindrical body having a diameter equal to a determined electrode section separation, each elongate separator pin being about 20 to 40 mm in length and having a maximum diameter of about 1.5 to 3 mm.

18. A tool for reconfiguring the pins of an electrical connector used to electrically couple a tractor to a trailer, said tool comprising:

a handle having a proximal end and distal end;

a head attached to the distal end of the handle, said head having a free end and an attached end, the attached end being opposite the free end and attached to the distal end of the handle;

a plurality of openings in the free end of the head, the plurality of openings leading to a plurality of parallel channels within the head, each opening leading to one channel, each channel, except one channel, being equal in diameter and length to each other channel; and an elongate separator pin fixed within each channel, the separator pin being concentric with the channel and having a conical nose attached to a cylindrical body, said cylindrical body having a diameter equal to a determined electrode section separation, each channel having a depth of about 15 to 30 mm and a diameter of approximately 6 to 10 mm.

* * * * *